(12) United States Patent
Desai et al.

(10) Patent No.: US 8,688,400 B2
(45) Date of Patent: Apr. 1, 2014

(54) SIGNAL GENERATOR PRODUCING INTERSYMBOL INTERFERENCE EFFECTS ON SERIAL DATA

(75) Inventors: Sampathkumar R. Desai, Bangalore (IN); Muralidharan A. Karapattu, Bangalore (IN)

(73) Assignee: Tektronix International Sales GmbH, Rheinfall (CH)

( * ) Notice: Subject to any disclaimer, the term of this patent is extended or adjusted under 35 U.S.C. 154(b) by 1410 days.

(21) Appl. No.: 12/357,291

(22) Filed: Jan. 21, 2009

(65) Prior Publication Data

US 2009/0195525 A1 Aug. 6, 2009

(30) Foreign Application Priority Data

Jan. 31, 2008 (IN) .......................... 220/MUM/2008

(51) Int. Cl.
*G01R 29/26* (2006.01)
*H04L 1/20* (2006.01)

(52) U.S. Cl.
USPC ................ 702/124; 702/69; 702/67; 375/348

(58) Field of Classification Search
USPC ................................................ 702/67, 66, 69
See application file for complete search history.

(56) References Cited

U.S. PATENT DOCUMENTS

| | | | |
|---|---|---|---|
| 5,889,823 A * | 3/1999 | Agazzi et al. ................. 375/341 |
| 7,061,978 B2 * | 6/2006 | Shanbhag et al. ............ 375/233 |
| 7,388,937 B1 * | 6/2008 | Rodger et al. ................ 375/348 |
| 7,848,396 B1 * | 12/2010 | Wu ................................ 375/220 |
| 8,224,613 B2 * | 7/2012 | Calvin et al. .................. 702/118 |
| 2007/0156360 A1 * | 7/2007 | Romero ........................ 702/69 |
| 2008/0313516 A1 * | 12/2008 | Raja et al. .................... 714/738 |
| 2010/0241906 A1 * | 9/2010 | Thompson et al. ............ 714/40 |

* cited by examiner

*Primary Examiner* — Jonathan C. Teixeira Moffat
*Assistant Examiner* — Regis Betsch
(74) *Attorney, Agent, or Firm* — William K. Bucher; Michael A. Nelson; Marger Johnson & McCollom PC

(57) ABSTRACT

A device and method for generation of Intersymbol interference (ISI) effects on serial data by direct digital synthesis is described. The features of the present invention allow a user to set parameters such as data rate, voltage amplitude, encoding scheme etc. as per requirements. An ISI parameter value is selected and applied to the serial data to produce ISI effects in the serial data. Alternatively according to another feature the patterns may be set as per industry standards.

15 Claims, 12 Drawing Sheets

Figure 5

| Base Pattern | Transmitter | Channel/Cable | 120 |

Periodic Jitter (Pk-Pk)

| | Magnitude: | | Frequency (Hz) | | Phase (°): |
|---|---|---|---|---|---|
| ☑ Sine1: | 0.000 ◁▷ | UI ▷ | 10.000000 m ◁▷ | | 0.00 ◁▷ |
| ☑ Sine2: | 0.000 ◁▷ | UI ▷ | 10.000000 m ◁▷ | | 0.00 ◁▷ |
| ☑ Sine3: | 0.000 ◁▷ | UI ▷ | 10.000000 m ◁▷ | | 0.00 ◁▷ |
| ☑ Sine4: | 0.000 ◁▷ | UI ▷ | 10.000000 m ◁▷ | | 0.00 ◁▷ |

Random Jitter (RMS)

| | Magnitude: | | Frequency-Low (Hz): | Frequency-High (Hz): |
|---|---|---|---|---|
| ☑ Rj1: | 0.000 ◁▷ | UI ▷ | 100.000 K ◁▷ | 500.000000 M ◁▷ |
| ☑ Rj2: | 0.000 ◁▷ | UI ▷ | 100.000 K ◁▷ | 500.000000 M ◁▷ |

SSC

Shape: Triangle ▷
Spread: Down ▷
Unequal Spread: 0.00 ◁▷ %
df/dt: 0.000 ◁▷ ppm/µs Frequency
Deviation: 4000.000 ◁▷ ppm
Modulation: 33.000 K ◁▷ Hz ☐ Noise: 0.000 ◁▷ ppm ☑ Noise: 0.000 ◁▷ Volt (RMS) Add Noise At: Near end ▷
☑ Pre/De-emphasis: 0.000 ◁▷ dB ▷

| f(Sj) [MHz] | Tj(JTRBRrx)-10% [mUI] | ISI [mUI] | RJ(RMS) [mUI] | SJ [mUI] |
|---|---|---|---|---|
| 2 | 1268.9 | 97 | 17.8 | 953 |
| 10 | 589.9 | 97 | 17.8 | 274 |
| 20 | 546.9 | 97 | 17.8 | 231 |

Figure 12

SIGNAL GENERATOR PRODUCING INTERSYMBOL INTERFERENCE EFFECTS ON SERIAL DATA

CROSS REFERENCE TO RELATED APPLICATION

This application claims priority from Indian provisional patent application No. 220/MUM/2008, filed Jan. 31, 2008.

TECHNICAL FIELD

The present invention relates generally to signal generators and more specifically to a signal generator that produces intersymbol interference (ISI) effects on serial data by direct digital synthesis.

BACKGROUND OF THE INVENTION

High speed serial data designers are required to design robust and reliable receivers to meet the required Bit Error Rate (BER) for specified conditions. Receiver testing of any high speed serial data standard will include compliance testing and jitter tolerance testing. The compliance test comprises the testing of the receiver's performance for specified conditions to achieve the desired result. The tolerance tests involve subjecting the receiver to progressively increasing jitter until breakdown. The jitter can be classified as deterministic jitter $D_j$ and random jitter $R_j$. The deterministic jitter $D_j$ is comprised of periodic jitter $P_j$, duty cycle distortion (DCD) and Intersymbol interference (ISI). ISI is inevitable in most physical systems due to limited bandwidth. Both DCD and ISI depend on the type of data stream and data rate. These are correlated with data and are classified as data dependent jitter (DDJ). Therefore to carry out compliance and jitter tolerance tests, it is important that the serial data is subjected to jitter in a controlled manner.

Intersymbol interference is currently generated using a circuit board on which signal traces are formed having various lengths, such as a differential Intersymbol interference (ISI) Test Board, manufactured and sold by Synthesys Research Inc., Menlo Park, Calif. One of the challenges of using such circuit boards is that the characteristic of the trace varies with the pattern and data rate. Further, the traces come with a Fixed ISI for a given data rate, hence it is not possible to generate intermediate ISI values. Typical trace lengths of a Synthesis Research ISI Test Board are 2.42", 5", 6.75", 9", 12", 17", 24", 31", and 40" which does not allow for intermediate trace lengths between the set lengths. Normally, users would like to know the exact break point of their design but do not have the fine control over the ISI generated out of the ISI Test Board.

Another issue is that changing from one trace to another needs calibration. This is often time consuming because not only the ISI needs to be calibrated but all the other associated jitters, such as $P_j$ and $R_j$, need to be calibrated. Additionally, the actual ISI output from the test board may not exactly match the ISI in the test board data sheet because of other components, such as connectors, cables and the like, in the test system which would interfere with the ISI generated. This requires the calibration of test system for each new test set-up.

SUMMARY OF THE INVENTION

Accordingly, the present invention is to a signal generating device, such as a signal generator, and a method of setting serial data pattern parameters and an intersymbol interference effects parameter to generate a serial data pattern having intersymbol interference effects. The signal generating device has a display and a central processing unit generating a user interface on the display for setting parameters for the serial data pattern and the parameter for intersymbol interference effects on the serial data pattern. The central processing unit generates a waveform record file using the serial data pattern parameters and the intersymbol interference effects parameter. A waveform generation circuit receives the waveform record file and generates a serial data pattern analog output signal having intersymbol interference effects defined by the intersymbol interference parameter.

The display may be internal to the signal generating device or an external display coupled to the signal generating device. An external controller, such as a personal computer, may be coupled to the signal generating device with the external controller generating the user interface on an external display for setting parameters for the serial data pattern and the parameter for intersymbol interference effects on the serial data pattern and generating the waveform record file using the serial data pattern parameters and the intersymbol interference effects parameter for use by the waveform generation circuit.

The intersymbol interference effects parameter has a range from 0.0 to 1.0 Unit Intervals or 1 picosecond to 2 microseconds depending on the unit value for the intersymbol interference effects parameter. The central processing unit increments the intersymbol interference effects parameter in units of 0.001 Unit Interval where the intersymbol interference effects parameter is expressed in Unit Intervals and 1.0 picosecond where the intersymbol interference effects parameter is expressed in time. The intersymbol interference effects in the waveform record file are generated by a single pole digital infinite impulse response (IIR) low pass filter controlled by the intersymbol interference effects parameter.

A method of generating intersymbol interference effects on a serial data pattern has the steps of generating a user interface on a display device for setting serial data pattern parameters and an intersymbol interference effects parameter, selecting parameters for a serial data pattern and selecting a parameter for intersymbol interference effects on the serial data pattern. A waveform record file is generated from the serial data pattern parameters and the intersymbol interference effects parameter and a serial data pattern analog signal is generated from the waveform record file having intersymbol interference effects defined by the intersymbol interference effects parameter.

The generation of the intersymbol interference effects on a serial data pattern of the waveform record file has the step of generating a single pole digital IIR low pass filter controlled by the intersymbol interference effects parameter for generating the intersymbol interference effects in the waveform record file. The generation of the waveform record file includes the step of compiling the serial data parameters to generate serial data pattern digital data modified by the single pole digital IIR low pass filter defined by the intersymbol interference effects parameter.

A method of calibrating intersymbol interference effects on a serial data pattern in a signal channel includes the steps of connecting a signal generating device to a waveform display and processing instrument, selecting parameters for the serial data pattern, and selecting a parameter for intersymbol interference effects on the serial data pattern to an initial value of zero. A waveform record file is generated from the serial data pattern parameters and the intersymbol interference effects parameter, and a serial data pattern analog signal is generated from the waveform record file having intersymbol interference effects defined by the intersymbol interference effects parameter. An intersymbol interference value is generated in the waveform display and processing instrument from the received serial data pattern analog signal from the signal generating device and coupled to the signal generating device. The intersymbol interference effects parameter is incremented by 0.1 to a maximum intersymbol interference value of 1.0 with the steps of generating the waveform record file, the serial data pattern analog signal, the intersymbol interference value, and the coupling of the intersymbol interference value to the signal generating device being repeated for each incremental value on the intersymbol interference effects parameter. A linear equation is generated from a curve fit of the intersymbol interference values, with the parameters of the linear equation being applied to an IIR filter controlled by the intersymbol interference effects parameter for generating the intersymbol interference effects in the waveform record file.

The objects, advantages and other novel features of the present invention are apparent from the following detailed description when read in conjunction with the appended claims and attached drawings.

BRIEF DESCRIPTION OF THE DRAWINGS

FIG. 5 is a representation of a Transmitter pop-up window in the user interface for producing ISI effects on a serial data pattern according to the present invention.

FIG. 12 is a chart showing jitter component setting for Display Port high speed serial data pattern.

DETAILED DESCRIPTION OF THE INVENTION

Figure 1:
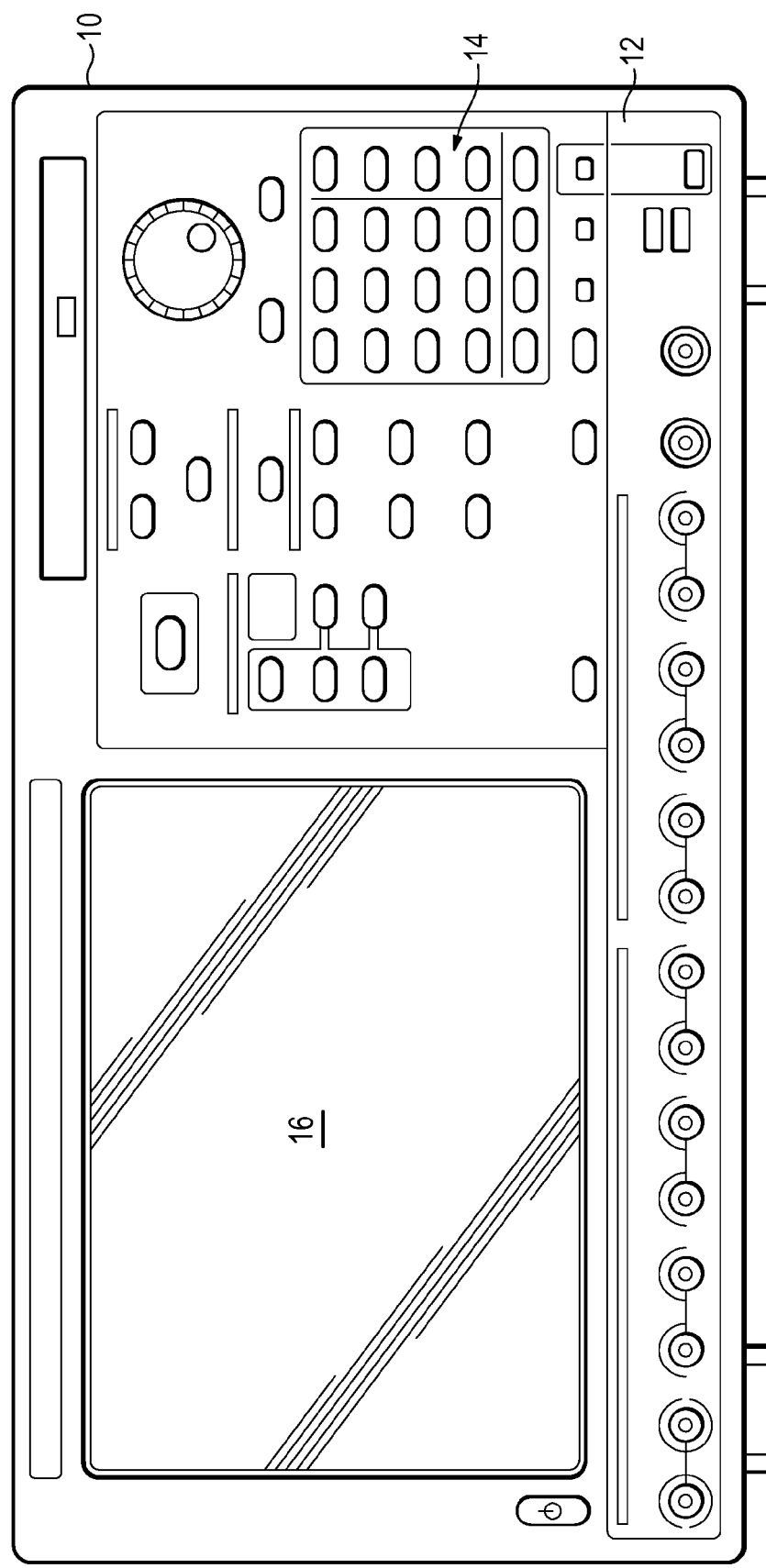
FIG. 1 is a front view of a signal generator for producing ISI effects on a serial data pattern according to the present invention.

Referring to FIG. 1, there is shown a signal generator 10, such as the AWG7102 manufactured and sold by Tektronix, Inc. Beaverton, Oreg. The signal generator 10 has a front panel 12 with controls 14, such as buttons and knobs or the like, and a display device 16, such as a liquid crystal display, cathode ray tube or the like. The signal generator 10 also has a CD or DVD/CD drive for storing waveform data, executable programs and the like. User defined signals are generated and output by the signal generator 10 using the front panel controls in conjunction with a user interface displayed on the display device 16.

Figure 2:
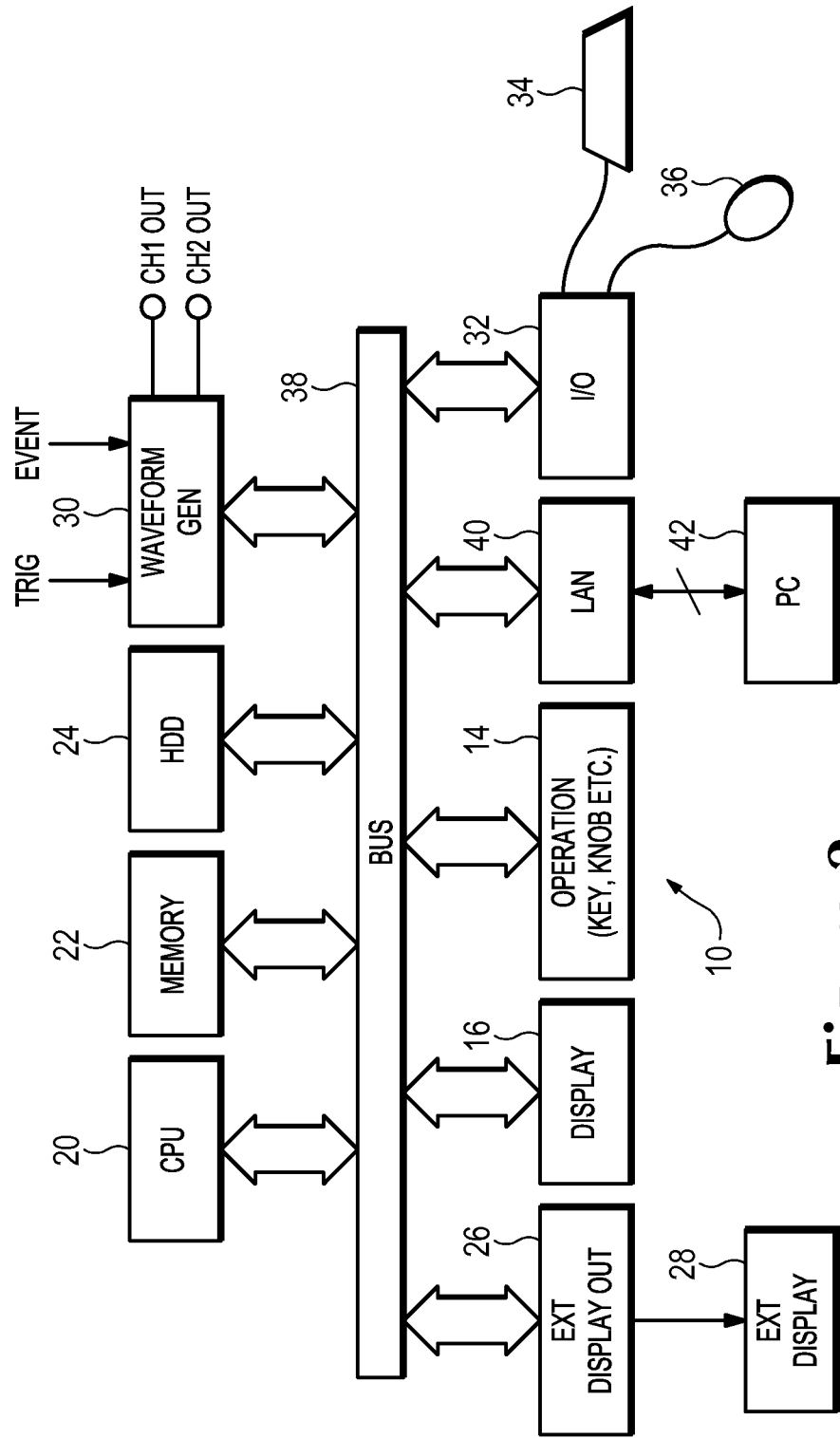
FIG. 2 is a representative block diagram of a signal generator according to the present invention.

Referring to FIG. 2, there is shown a representative block diagram of the AWG7102 signal generator 10 for producing Intersymbol interference effects on serial data. The signal generator 10 has a central processing unit (CPU) 20 that controls the operation of the instrument according to programs stored on electronic media, such as a Compact Disc (CD). A memory 22, such as RAM memory, is used for a work area for the CPU 20 to read programs from storage device 24, such as a hard disk drive. A user can set up the signal generator 10 to generate an output test signal via the buttons, knobs and the like 14 on the front panel 12 of the instrument. The display device 16 may display a user interface for setting various parameters for the output test signal and visualizing an output signal as a function of the parameter settings. An external display output circuit 26 provides a video output which may be connected to an external display 28 for providing a larger display area in addition to the built-in display 16 of the signal generator. A waveform generation circuit 30 generates the output test signal based on user defined parameters. In this example, the waveform generation 30 circuit has a trigger input and an event input and two channel outputs. An input/output port 32 is used for connecting an external keyboard 34, a pointing device, such as a mouse 36, and the like to the signal generator. The external keyboard 34 and/or mouse 36 may be included as part of the front panel controls of the signal generator for setting parameters. The blocks are coupled together via a signal and data bus 38. The bus 38 of the signal generator may have a Local Area Network (LAN) interface 40 for connecting the signal generator to an external controller, such as a personal computer (PC) 42 or other testing instruments. The LAN interface 40 allows the user interface to operate on the PC 42 and pass output signal data to the signal generator 10 and also enables the PC 42 to control the signal generator 10 over a network. Alternatively, a General Purpose Interface Bus (GPIB) interface may be used for the LAN interface 40.

Figure 3:
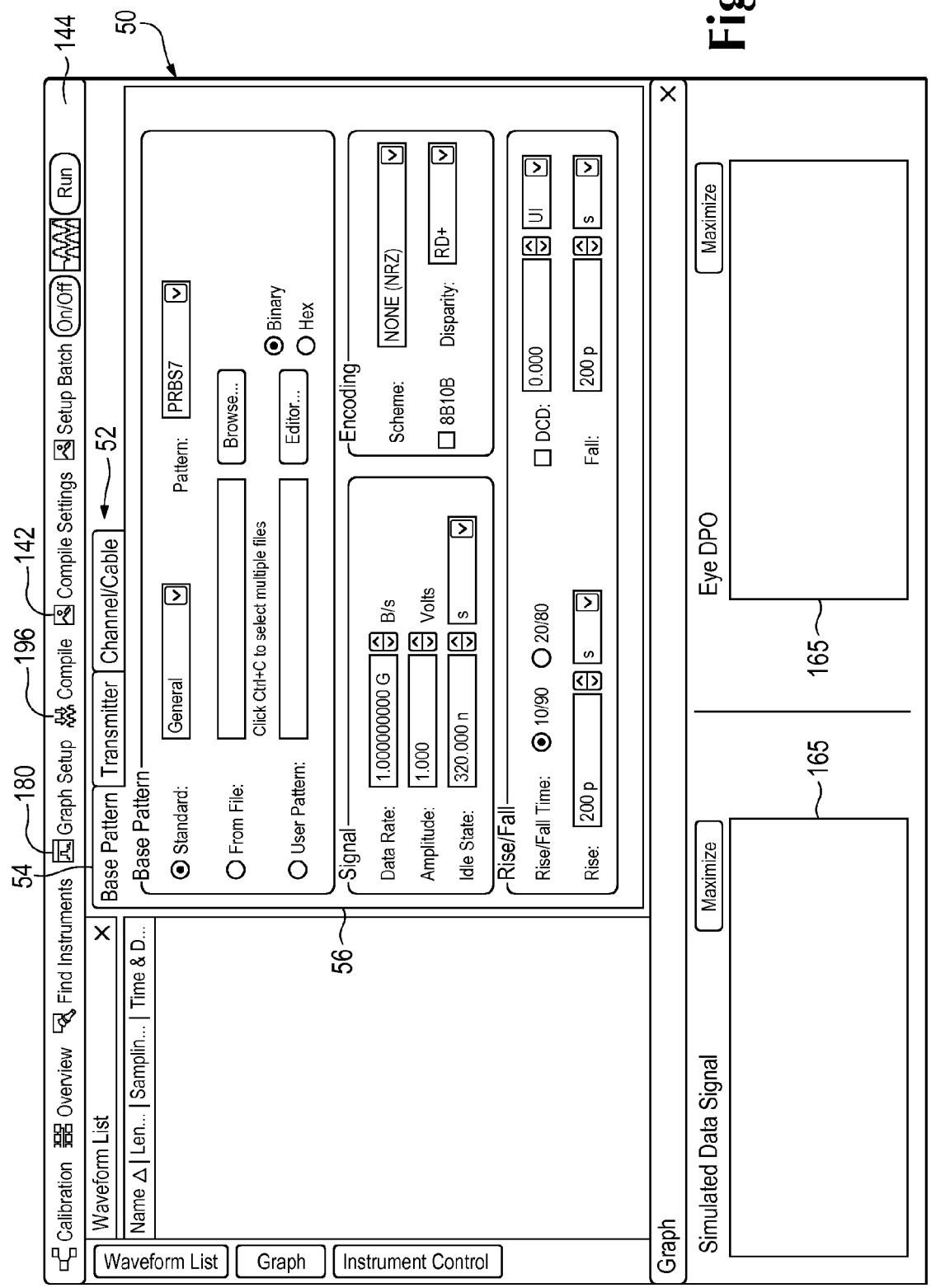
FIG. 3 is an initial user interface for producing ISI effects on a serial data pattern according to the present invention.

Referring to FIG. 3, there is shown an initial user interface 50 for setting parameters to produce various levels of Intersymbol interference (ISI) effects on serial data patterns. The initial user interface 50 and subsequent user interfaces operate under program control of the CPU 20 with the user interface programs stored on the storage device 24. The user interfaces may be displayed on the display device 16 or on the external display 28. Alternately, the user interface programs may be stored and accessed by the PC 42 with the PC 42 processing the parameters and generating an output file that is coupled to the signal generator 10. The programs controlling the various interfaces on the signal generator 10 may be accessed via an icon on the display device 16 or by clicking on a start tab and clicking the appropriate program from a list of programs stored in the signal generator 10. The initial interface 50 includes a number of pop-up windows that are activated by clicking on various tabs 52 in the initial user interface 50. The initial user interface 50 has a BASE PATTERN tab 54 that activates a BASE PATTERN pop-up window 56. The BASE PATTERN pop-up window 56 is automatically activated with the initial user interface 50.

Figure 4:
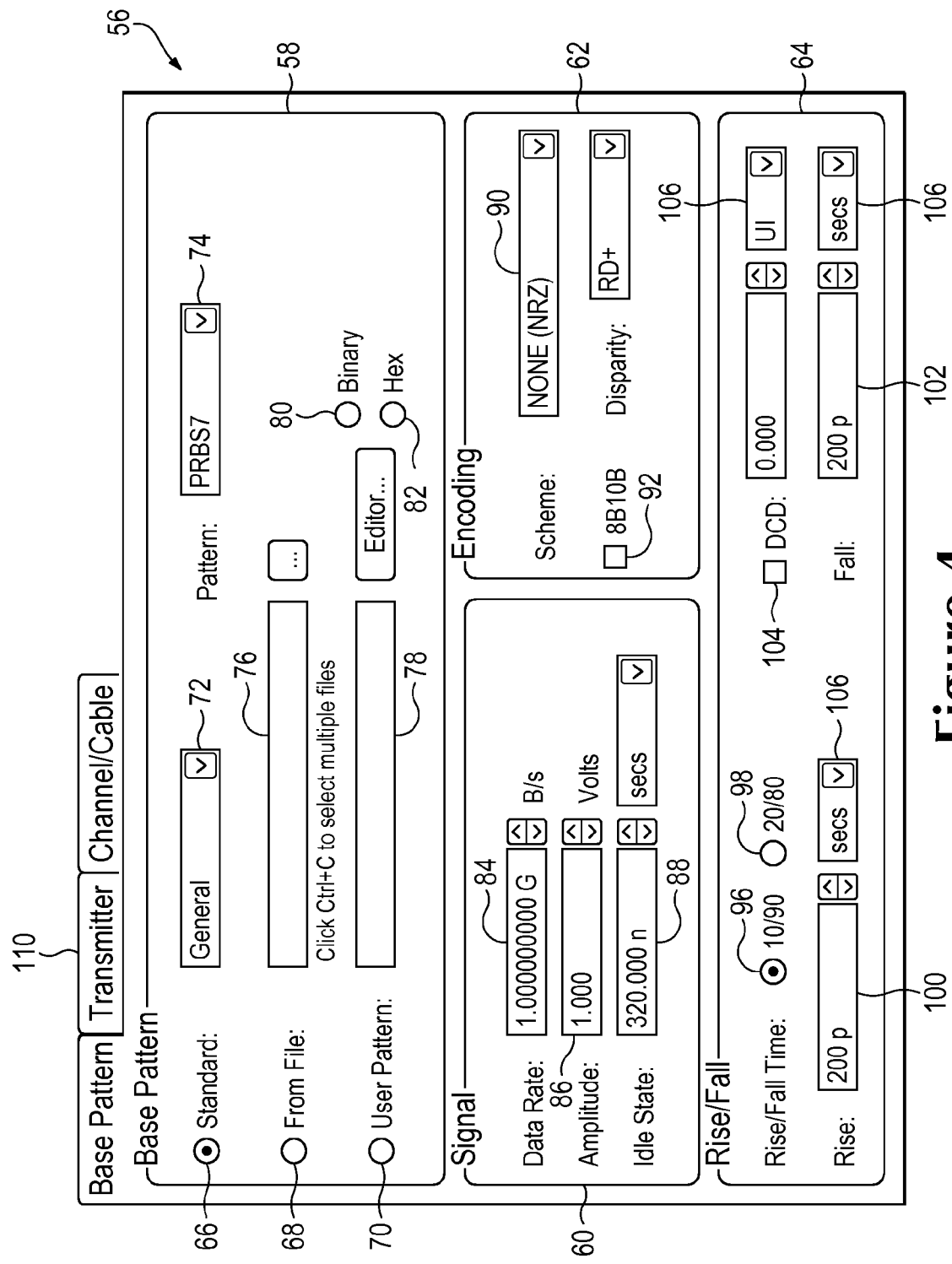
FIG. 4 is a representation of a base pattern pop-up window in the user interface for producing ISI effects on a serial data pattern according to the present invention.

FIG. 4 is a more detailed representation of the BASE PATTERN pop-up window 56 showing four defined regions of the BASE PATTERN pop-up window 56: BASE PATTERN 58, SIGNAL 60, ENCODING 62 and RISE/FALL 64. The BASE PATTERN region 58 has buttons 66, 68 and 70 that allows a user to select a serial data pattern on which the ISI effects are generated. Clicking on the STANDARD button 66 activates a STANDARD box 72 and a PATTERN box 74. Click on the STANDARD box 72 displays a general serial data pattern and various serial data standards requiring compliance testing. Once a particular serial data standard is selected, clicking on the PATTERN box 74 displays various waveform patterns defined by the selected serial data standard, such as PRBS7. Clicking on the FROM FILE button 68 highlights a FILE box 76 in which a user can enter a previously stored data file. Clicking on the USER PATTERN button 70 highlights a Pattern Box 78 in which a user may enter a serial data pattern. The pattern may be entered as "0" and "1" binary data or hexadecimal data by clicking on appropriate BINARY or HEX buttons 80, 82.

The SIGNAL region 60 has a DATA RATE box 84, an AMPLITUDE box 86, and an IDLE STATE box 88. Clicking on the DATA RATE box 84 allows a user to set the data rate of the serial data. The data rate may be adjusted from 10 Mega Bits per second to 20 Giga bits per second. When the STANDARD button 66 is activated, the data rate is automatically selected as a function of the selected serial data standard. Clicking on the AMPLITUDE box 86 allows the user to select the voltage level of the serial data pattern. The user may vary the voltage level from 250 mV to 1V. The IDLE STATE box 88 is active when SATA is selected in the STANDARD box 72 and Idle Pattern is selected in the PATTERN box 74. The Idle State may be viewed as selectable periods of DC within the Idle State pattern.

The ENCODING region 62 has an ENCODING SCHEME box 90 that allows the user to set the type of coding scheme for the serial data pattern. A user may select from NRZ or NONE NRZ. Clicking on the 8B10B box 92 activates an algorithm for the mapping of 8-bit symbols to 10-bit symbols to achieve DC-balance and bounded disparity. The RISE/FALL region 64 has RISE/FALL TIME buttons 96 and 98 for respectively selecting 10/90 or 20/80 percent rise and fall time. A RISE box 100 allows the user to select the rise time of the serial data pattern leading edges. A FALL box 102 allows the user to set the fall time of the serial data pattern trailing edges. The DCD box 104 allows the user to vary the amount of Duty Cycle Distortion in the serial data pattern. The rise, fall and DCD times may be defined in seconds or unit intervals using the respective SETTING boxes 106.

Clicking on the TRANSMITTER tab 110 activates a TRANSMITTER pop-up window 112 as shown in FIG. 5. The TRANSMITTER pop-up window 112 has boxes 114 that allow the user to set parameters for variable amounts of peak-to-peak Periodic Jitter and RMS Random Jitter, set Spread Spectrum Clock (SSC) parameters, Noise parameters in Volts (RMS) and Pre/De-emphasis parameters in dB or volts. The user has the option of placing the noise at the near end or the far end of the serial data pattern.

Figure 6:
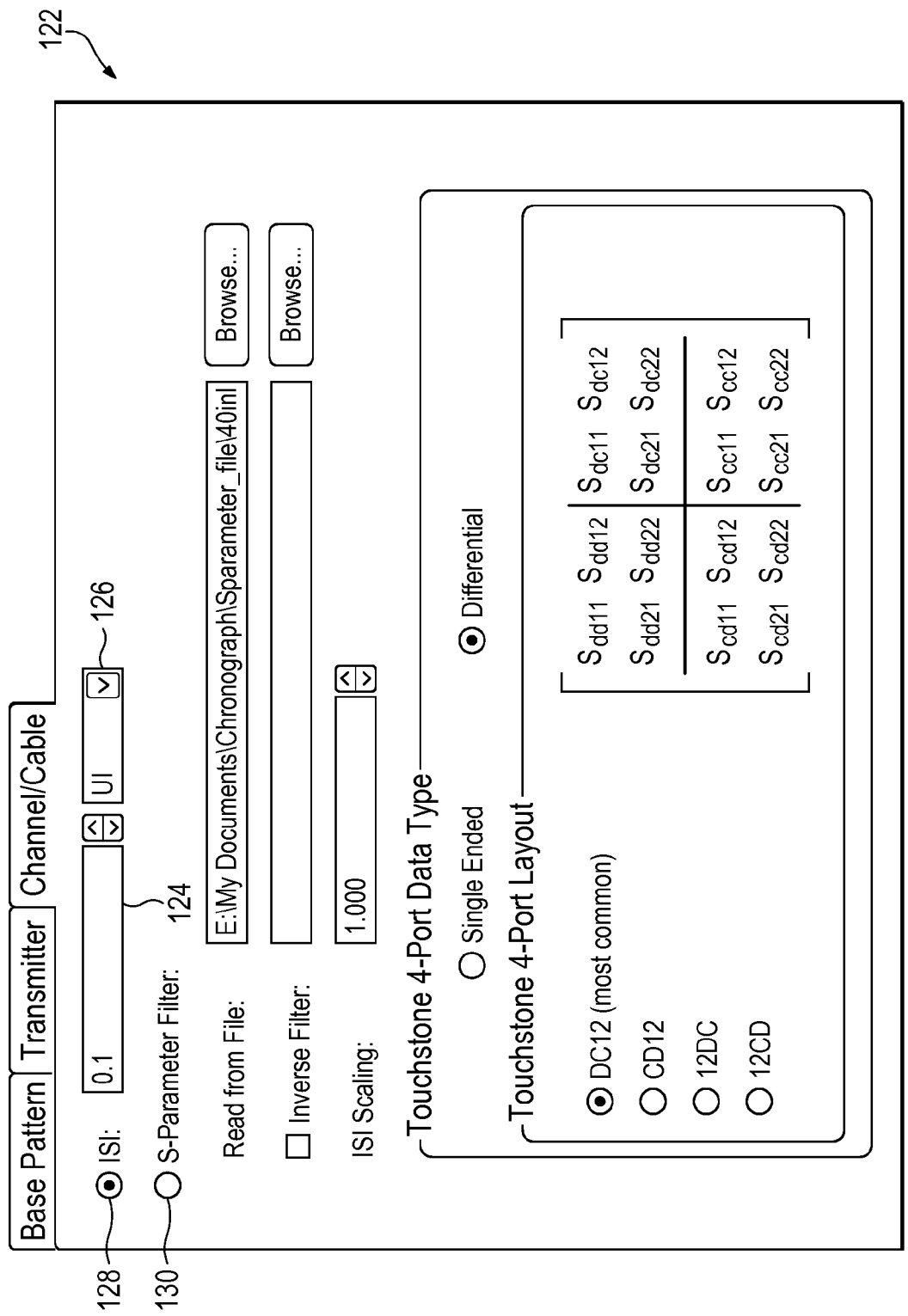
FIG. 6 is a representation of a channel/cable pop-window in the user interface for producing ISI effects on a serial data pattern according to the present invention.

Clicking on the CHANNEL/CABLE tab 120 activates a CHANNEL/CABLE pop-window 122 as shown in FIG. 6. The user activates an ISI box 124 and SETTING box 126 by clicking on an ISI button 128. The user selects an amount of ISI to be applied to the serial data pattern by clicking on the ISI box 124 and entering an amount. The amount of ISI may be expressed in seconds or unit intervals. The selection range for the ISI is 0.0 to 1.0 Unit Interval that is incremented in units of 0.001 Unit Interval when ISI is expressed in Unit Intervals. The selection range for the ISI is 1 picosecond to 2 microseconds that is incremented in units of 1 picosecond when ISI is expressed in seconds. The user may also activate boxes that allow the user to select touchstone S-Parameters files and add ISI scaling to the files by clicking on an S-Parameter Filter button 130.

Figure 7:
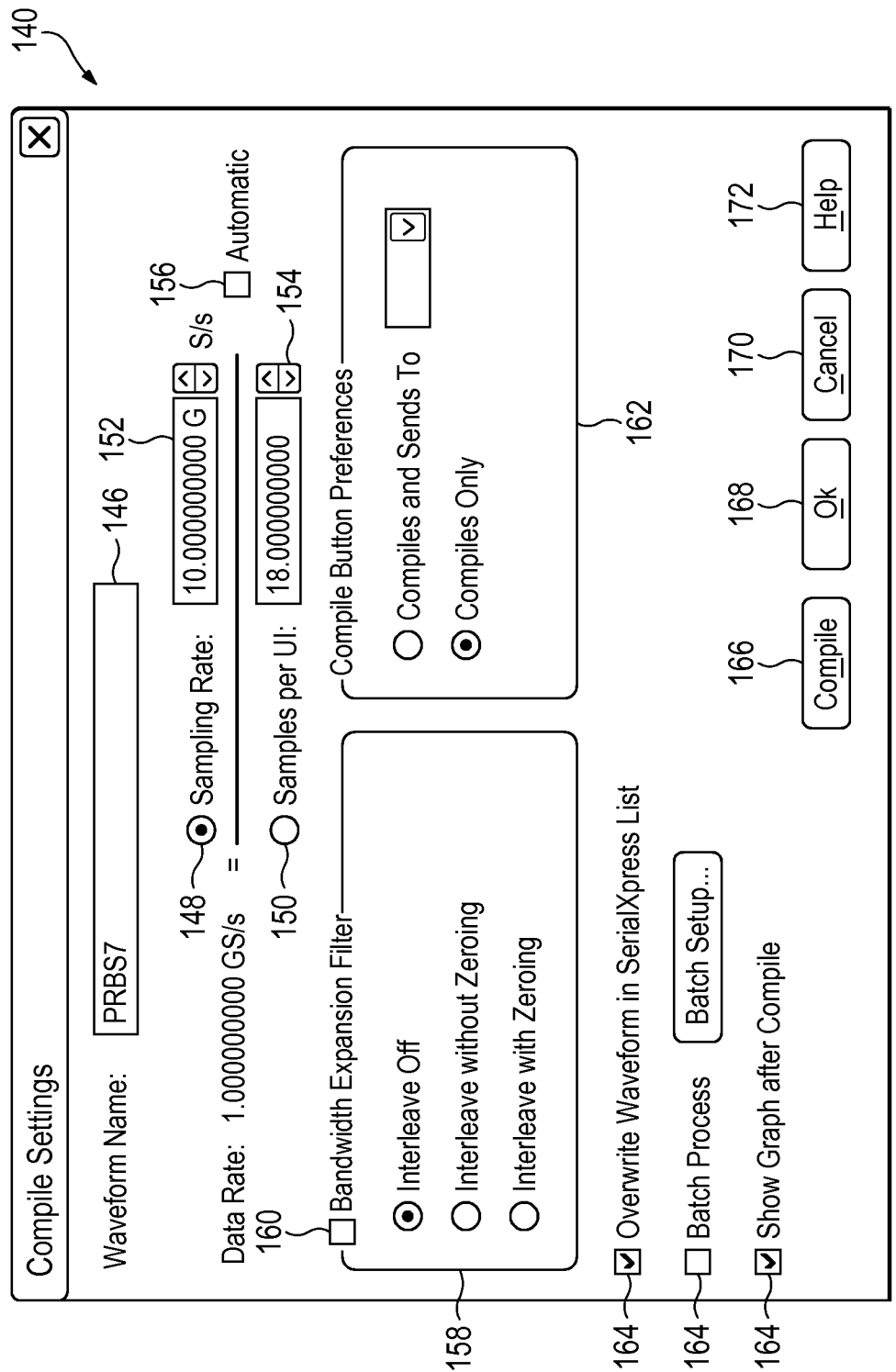
FIG. 7 is a representation of a compile setting in the user interface for producing ISI effects on a serial data pattern according to the present invention.

Referring back to FIG. 3, once the user has set the parameters for the serial data pattern and selected the amount of ISI to be applied to the serial data pattern, the user activates a COMPILE SETTINGS pop-up window 140, shown in FIG. 7, by clicking on a COMPILE SETTINGS button 142 on the initial user interface 50 tool bar 144. The COMPILE SETTINGS pop-up window 140 has a WAVEFORM NAME box 146 for providing a user defined name for a waveform file generated by the signal generator 10 using the user defined parameters and ISI value for the serial data pattern. The data rate for the serial data pattern entered using the BASE PATTERN pop-up window 56 is displayed next to "Data Rate". The user can click on a SAMPLE RATE button 148 or a SAMPLES PER UI button 150 to activate respective SAMPLE RATE or SAMPLES PER UI boxes 152, 154. The user may manually set the sampling rate or samples per UI by entering appropriate values based on the serial data pattern and the data rate. The sampling rate or samples per UI may be automatically set based on the data rate and the serial data pattern by clicking on AUTOMATIC box 156. A BANDWIDTH EXPANSION FILTER region 158 may be activated by clicking on a BANDWIDTH EXPANSION FILTER button 160. The BANDWIDTH EXPANSION FILTER region 158 allows a user to select or turn off various interleaving parameters. A COMPILE BUTTON PREFERENCES region 162 allows the user to select either COMPILE ONLY or COMPILE AND SENT TO parameters for the compiled waveform record defined by the serial data pattern parameters and the ISI parameter. Toward the bottom of the COMPILE SETTINGS pop-up window 140 are additional parameters that may be set by clicking on the appropriate boxes 164. One of the parameters is SHOW GRAPH AFTER COMPILE which displays the serial pattern data in various forms in two graph regions 165 at the bottom of the initial user interface 50. At the bottom of the COMPILE SETTINGS pop-up window 140 are COMPLE, OK, CANCEL and HEPL buttons 166, 168, 170 and 170 that allows the user to select various options related to the COMPILE SETTINGS pop-up window 140. One option is to click on the COMPILE button 166 that initiates the compiling of the serial data pattern and ISI parameters to generate a waveform record file containing digital data for generating an analog serial data pattern from the signal generator 10. Another option is to click on the OK button 168 that saves the parameters selected in the COMPILE SETTINGS pop-up window 140 and closes the window 140. A further option is to click on the CANCEL button 170 that closes the COMPILE SETTINGS pop-up window 140 without saving the parameters selected in the window 140. Clicking on the HELP button 172 activates a HELP pop-up window from which the user may seek help.

Figure 8:
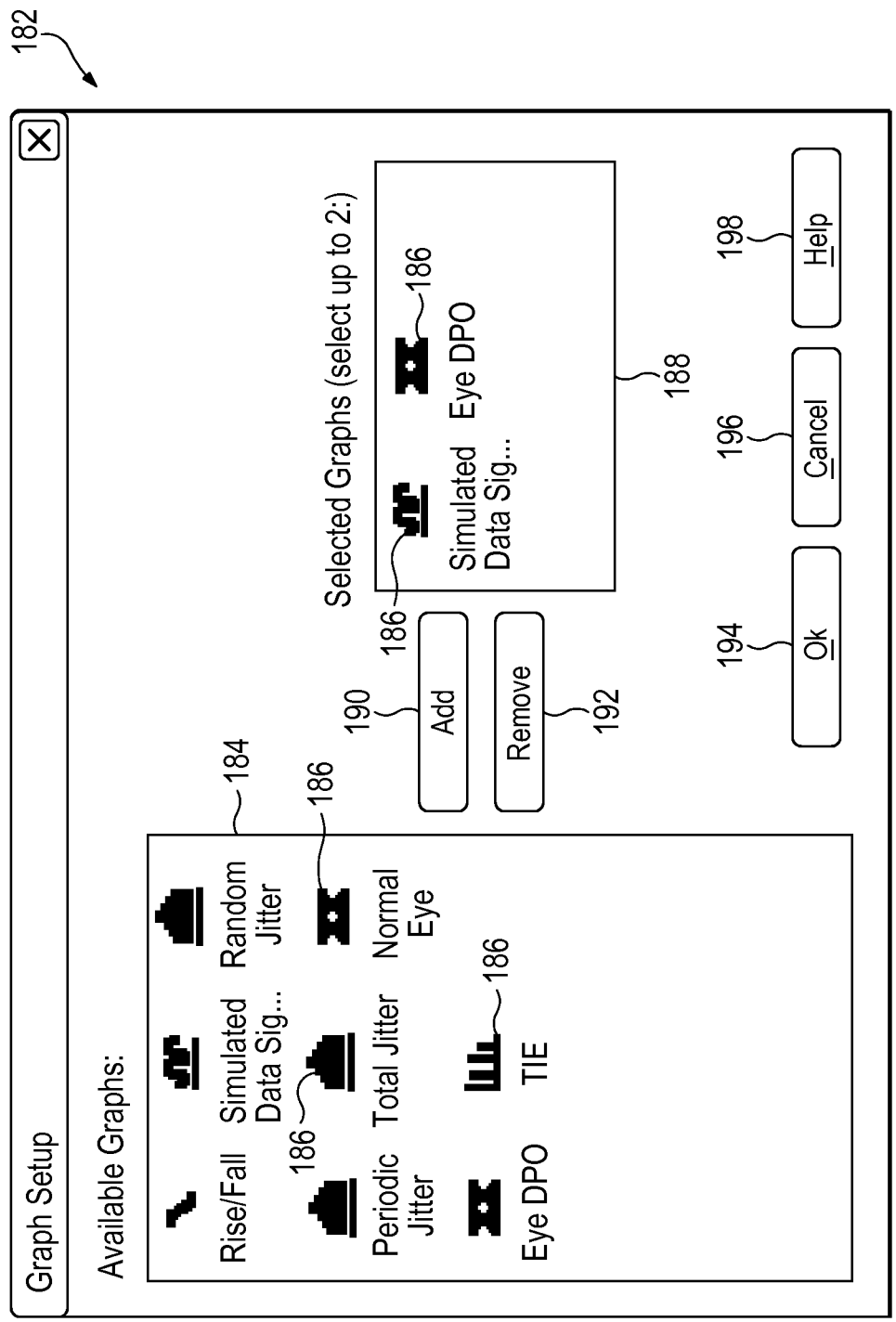
FIG. 8 is a representation of a graph setup in the user interface for producing ISI effects on a serial data pattern according to the present invention.

Referring back to FIG. 3 again, initial user interface 50 tool bar 144 has a GRAPH SETUP button 180 which may be clicked to activate a GRAPH SETUP pop-up window 182 as shown in FIG. 8. The GRAPH SETUP pop-up window 182 has an AVAILABLE GRAPHICS box 184 on the left side containing a number of graphic symbols 186 and wording describing each of the graphic symbols 186. One the right side of window 182 is a SELECTED GRAPHICS box 188 containing graphic symbols 186 selected from the AVAILABLE GRAPHICS box 184. Between the boxes 184 and 188 is ADD and REMOVE buttons 190 and 192. These buttons 190, 192 add and remove the graphic symbols 186 from the SELECTED GRAPHICS box 188. A user selects a graphic symbol 186 from the AVAILABLE GRAPHICS box 184 by clicking on the graphic symbol 186 to highlight the symbol. Clicking on the ADD button 190 copies the selected symbol from the AVAILABLE GRAPHICS box 184 to the SELECTED GRAPHICS box 188. Clicking on a graphic symbol 186 in the SELECTED GRAPHICS box 188 to highlight it and clicking the REMOVE button deletes the selected graphic symbol 186 from the SELECTED GRAPHICS box 188. The SELECTED GRAPHICS box 188 may contain up to two symbols matching the number of graph regions 165 at the bottom of the initial user interface 50. At the bottom of the GRAPH SETUP pop-up window 182 are OK, CANCEL and HELP buttons 194, 196, 198. The OK button 194 saves the selected graphs and closes the GRAPH SETUP pop-up window 182. The Cancel button 196 closes the GRAPH SETUP pop-up window 182 without saving the selected graphs. The HELP button 198 activates a HELP pop-up window from which the user may seek help.

The initial user interface 50 tool bar 144 has a COMPILE button 196(as shown in FIG. 3) that functions in the same manner as the COMPILE button 166 (as shown in FIG. 7) in the COMPILE SETTINGS pop-up window 140 by initiating the compiling of the serial data pattern and ISI parameters to generate a waveform record file containing digital data for generating an analog serial data pattern from the signal generator 10.

Figure 9:
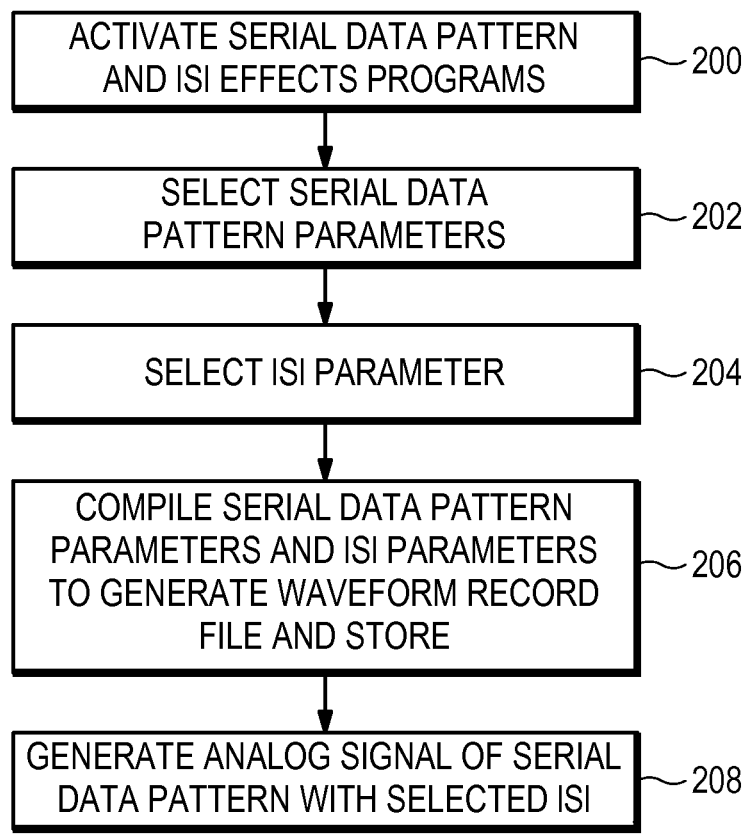
FIG. 9 is a flow chart representing the steps in producing ISI effects on serial data pattern according to the present invention.

FIG. 9 is a flow chart illustrating the steps in generating ISI effects on a serial data pattern with reference to previous figures. The process is entered by activating the program controls for generating the ISI effects on the serial data pattern at Step 200. The BASE PATTERN and the COMPILE SETTINGS pop-up windows 56, 140 are activated for selecting parameters of a serial data pattern that include the data rate, amplitude, encoding scheme, raise and fall time, and sample rate of the serial data pattern at Step 202. The Channel/CABLE pop-up window 122 is activated for selecting an amount of ISI that is to be applied to the serial data pattern at Step 204. The COMPILE button 196 on the initial user interface 50 tool bar 144 is activated which initiating the compiling of the serial data pattern parameters and ISI parameter to generate a waveform record file containing digital data for generating an analog serial data pattern from the signal generator 10 at Step 206. The waveform record file is stored in the memory 22 of the signal generator 10 and provided to the waveform generation circuit 30 that converts the waveform record file to an analog serial data pattern signal having ISI effects that is output by the signal generator 10 at Step 208. The step order for producing ISI effects on a serial data pattern is by example only and the order of the steps may be changed without departing from the scope of the invention. For example, the order in which the parameters are selected may be changed as well as which COMPILE button (COMPILE button 196 or COMPILE button 166) is used to initiate the compiling of the serial data pattern parameters and the ISI parameter.

In a specific example of generating ISI effects on a serial data pattern, the serial data pattern parameters are set as a general standard having a PRBS7 pattern having a data rate of 1 GB/s, a voltage amplitude of 1V, an encoding scheme that does not return to zero, rise and fall times of the leading and trailing edges of the serial data pattern of 200 psec at a 10 to 90 percent level and a sample rate of 10 Gs/s. The jitter, SSC, noise and Pre/De-emphasis parameters in the TRANSMITTER pop-up window 112 are set to zero. The ISI parameter is selected using the Channel/CABLE pop-u window 122. The ISI effects are generated using a single pole digital IIR (Infinite Impulse Response) low pass filter that is based on the data rate, sampling frequency and the data pattern. The digital IIR filter is controlled by the single ISI parameter. The recursive equation of the IIR filter is:

$$Y(n) = A \cdot x(n) - B \cdot y(n-1), \text{ where}$$

Figure 10A:
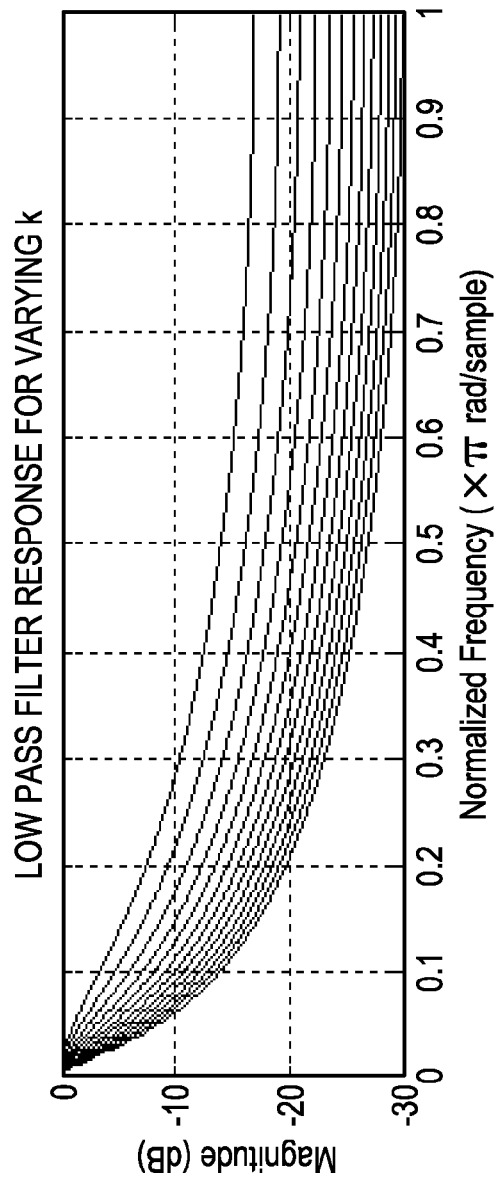
FIGS. 10A and 10B are respective graphs showing magnitude and phase responses versus frequency of a digital IIR filter producing ISI effects for different values of an ISI parameter "k".
Figure 10B:
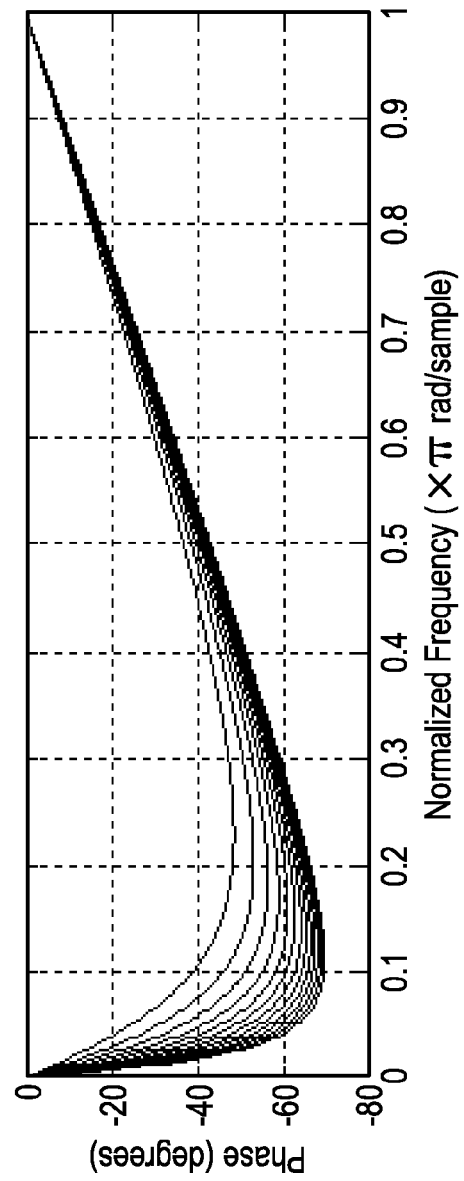

$A = 1/k$ and $B = (k-1)/k$
$x(n) =$ input serial data
$Y(n) =$ output data with desired ISI
$A =$ forward path multiplier
$B =$ recursive path multiplier The above recursive equation depicts a single pole IIR filter. The magnitude and phase responses versus frequency for the different values of k are shown in the graphs of FIGS. 10A and 10B. It is observed that as the single parameter k increases, the filter has a steeper fall off. The IIR filter is generated at the time the serial data parameters and the ISI parameter are compiled. The digital data representing the serial data pattern is generated and filtered by the IIR filter to modify the digital data to produce the ISI effects as a function of the selected ISI parameter.

Figure 11:
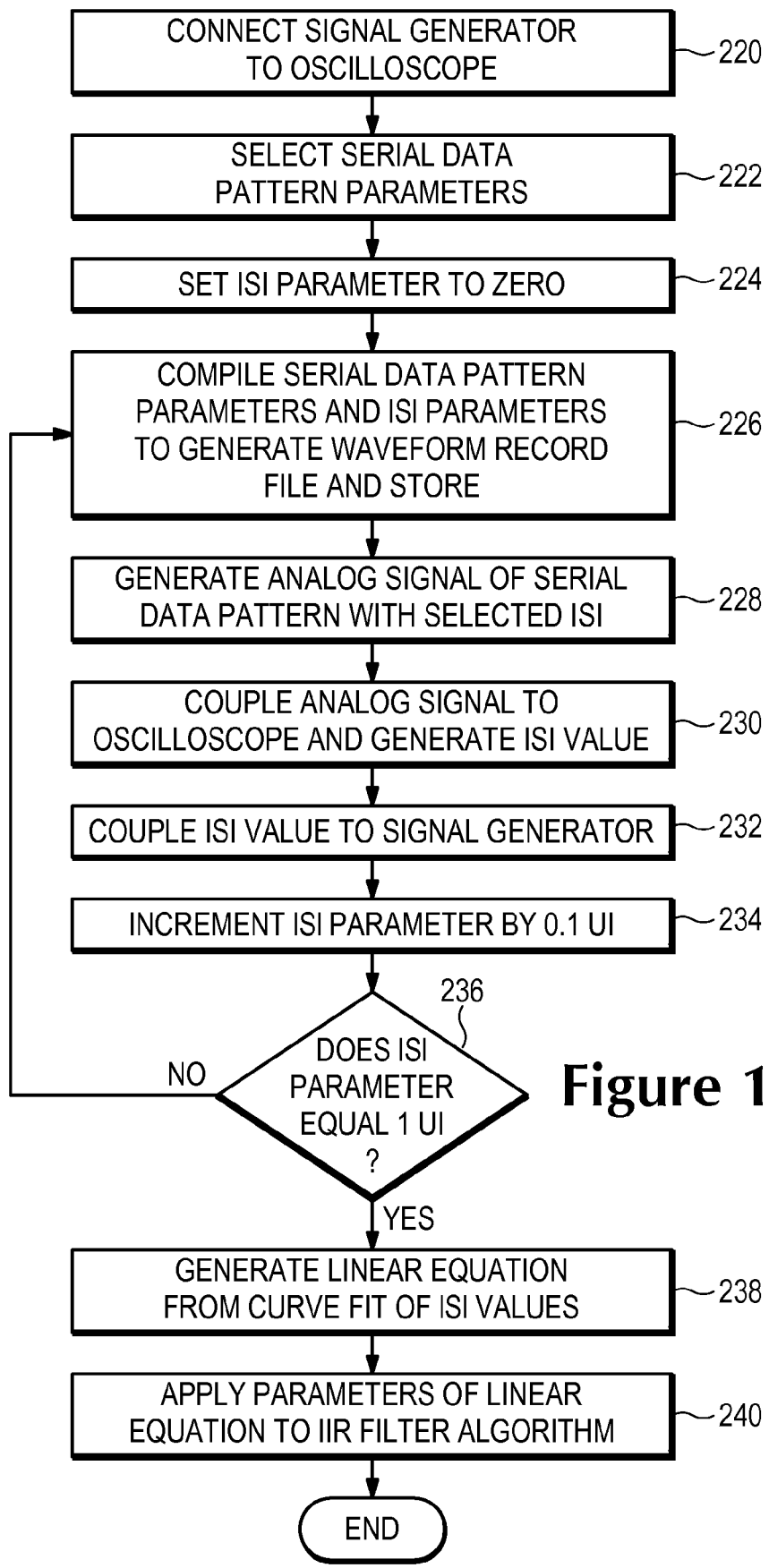
FIG. 11 represents a flow chart for calibrating the digital Infinite Impulse Response (IIR) filter producing ISI effects.

The ISI generated through the above described IIR filter needs to be calibrated. Even with the ISI parameter set to zero, a certain amount of ISI is measurable on a measurement instrument, such as an oscilloscope, due to the data pattern, the low pass nature of the signal generator 10 and the oscilloscope, and the cabling between the signal generator 10 and the oscilloscope. Referring to FIG. 11, there is shown a flow chart illustrating the steps in calibrating the ISI. The signal generator 10 is connected to the measurement instrument, such as a DPO72004 Digital Phosphor Oscilloscope using DPOJET Analysis Software, at step 220. One connection is from an output of the signal generator 10 to an input to the oscilloscope. A second connection is made between the signal generator 10 and the oscilloscope via a LAN or a GPIB bus. Serial data pattern parameters are set at Ste 222. The ISI parameter is set to zero at step 224 and the data pattern parameters and the ISI parameter are compiled to generate a waveform record file containing digital data for generating an analog serial data pattern with ISI effects. The waveform record file is stored at step 226. The waveform record file is processed by the waveform generation circuit 30 which converts the waveform record file to an analog serial data pattern with ISI effects and the signal generator 10 generates an analog serial data pattern with ISI effects output at step 228. The signal output is coupled to the oscilloscope which measures the resulting ISI due to data and hardware characteristics and generates a value for the ISI at step 230. The generated value for the ISI is coupled back to the signal generator 10 via over LAN or GPIB bus and stored at Step 232. The ISI parameter is incremented by 0.1 UI at Step 234 and the compiling, the generating and measuring of the resulting analog signal with the dialed-in ISI, and the generation, sending and storing of the ISI value from the oscilloscope to the signal generator 10 is repeated at STEP 236. The process continues with the ISI parameter being incremented by 0.1 UI until the ISI parameter is at 1 UI. A curve is fitted to the stored ISI values from the oscilloscope and a linear equation having slope and constant parameters is obtained at Step 238. The parameters of the equation are applied to the IIR filter algorithm at Step 240. The calibration of the ISI filter is valid for a given set of conditions. If the parameters of the data pattern or the signal path of the output signal are changed, then the resulting IIR filter will have to be calibrated again. The ISI calibration has been described in relation to Unit Intervals but may also be implements using seconds.

With the IIR filter calibrated, the user can add additional impairments to the digital signal pattern to test various serial data patterns. For example, Draft 13 from the Video Electronics Standards Association for the Display Port high speed serial data standard compliance specification call for a specific amount of ISI as well as other signal impairment as shown in FIG. 12. The injected jitter is composed of three elements: Intersymbol interference (ISI), Random Jitter ($R_j$), and Sinusoidal Jitter ($S_J$). While the ISI and ($R_j$) elements are kept constant, $S_J$ will differ based on its modulation frequency to achieve the required Total Jitter ($T_J$). FIG. 12 lists the settings that have to be tested for a reduced bit rate for an assumed jitter model of: 12.3$R_j$(RMS)+$D_j$=$T_J$. The Random Jitter ($R_j$), and Sinusoidal Jitter ($S_J$) are set by the user using the Transmitter pop-up window 112 and the ISI is set using the CHANNEL/CABLE pop-up window 122.

Although the invention has been disclosed in terms of the preferred and alternative embodiments disclosed herein, those skilled in the art will appreciate that modifications and improvements may be made without departing from the scope of the invention.

What is claimed is:

1. A signal generating device comprising:
   a display;
   a central processing unit generating a user interface on the display to allow a user to select parameters for a serial data pattern and a parameter for intersymbol interference on the serial data pattern wherein a waveform record file is generated using the serial data pattern parameters and the intersymbol interference (ISI) parameter; and
   a waveform generation circuit receiving the waveform record file and generating a serial data pattern analog output signal having generated intersymbol interference defined by the intersymbol interference parameter.

2. The signal generating device as recited in claim 1 wherein the display comprises an external display coupled to the signal generating device.

3. The signal generating device as recited in claim 1 further comprising an external controller coupled to the signal generating device with the external controller generating the user interface on an external display for setting parameters for the serial data pattern and the parameter for intersymbol interference on the serial data pattern and generating the waveform record file using the serial data pattern parameters and the intersymbol interference parameter for use by the waveform generation circuit.

4. The signal generating device as recited in claim 1 wherein the intersymbol interference parameter has a range from 0.0 to 1.0 Unit Intervals.

5. The signal generating device as recited in claim 4 wherein the central processing unit increments in the intersymbol interference in units of 0.001 Unit Interval.

6. The signal generating device as recited in claim 1 wherein the intersymbol interference parameter has a range from 0.0 picoseconds to 2.0 microseconds.

7. The signal generating device as recited in claim 6 wherein the central processing unit increments in the intersymbol interference in units of 1.0 picosecond.

8. The signal generating device as recited in claim 1 further comprising a single pole digital infinite impulse response (IIR) low pass filter controlled by the intersymbol interference parameter for generating the intersymbol interference in the waveform record file.

9. A method of generating intersymbol interference on a serial data pattern comprising the steps of:
   a) generating a user interface on a display device to allow a user to select serial data pattern parameters and an intersymbol interference (ISI) parameter;
   b) selecting parameters for a serial data pattern;
   c) selecting a parameter for intersymbol interference on the serial data pattern;
   d) generating a waveform record file from the serial data pattern parameters and the intersymbol interference parameter;
   e) generating a serial data pattern analog signal from the waveform record file having generated intersymbol interference defined by the intersymbol interference parameter.

10. The method of generating intersymbol interference on a serial data pattern as recited in claim 9 wherein the generating of the waveform record file step further comprises the step of generating a single pole digital infinite impulse response (IIR) low pass filter controlled by the intersymbol interference parameter for generating the intersymbol interference in the waveform record file.

11. The method of generating intersymbol interference on a serial data pattern as recited in claim 10 wherein the single pole digital IIR low pass filter representation takes the following form:

$$Y(n)=A \cdot x(n) - B \cdot y(n-1), \text{ where}$$

A=1/k and B=(k−1)/k
k=the intersymbol interference parameter
x(n)=input serial data
Y(n)=output data with desired ISI
A=forward path multiplier
B=recursive path multiplier.

12. The method of generating intersymbol interference on a serial data pattern as recited in claim 10 wherein the generating of the waveform record file step further comprises the step of compiling the serial data pattern parameters to generate serial data pattern digital data modified by the single pole digital IIR low pass filter defined by the intersymbol interference parameter.

13. The method of generating intersymbol interference on a serial data pattern as recited in claim 9 wherein the selecting of the intersymbol interference parameter further comprises the step of incrementing the intersymbol interference parameter in units of 0.001 Unit Interval.

14. The method of generating intersymbol interference on a serial data pattern as recited in claim 9 wherein the selecting of the intersymbol interference parameter further comprises the step of incrementing the intersymbol interference parameter in units of 1.0 picosecond.

15. A method of calibrating intersymbol interference effects on a serial data pattern in a signal channel comprising the steps of:
   a) connecting a signal generating device to a waveform display and processing instrument;
   b) generating a user interface on a display device of the signal generating device to allow a user to select parameters for the serial data pattern;
   c) selecting a parameter for intersymbol interference effects on the serial data pattern using the user interface on the display device of the signal generating device to allow the user to select an initial value of zero;
   d) generating a waveform record file from the serial data pattern parameters and the intersymbol interference effects parameter;
   e) generating a serial data pattern analog signal from the waveform record file having intersymbol interference effects defined by the intersymbol interference effects parameter;

f) generating an intersymbol interference value in the waveform display and processing instrument from the received serial data pattern analog signal from the signal generating device;
g) coupling the intersymbol interference value to the signal generating device;
h) incrementing the intersymbol interference effects parameter by 0.1 to a maximum intersymbol interference value of 1.0 and repeating steps c) through g) for each incremental value on the intersymbol interference effects parameter;
i) generating a linear equation from a curve fit of the intersymbol interference values; and
j) applying parameters of the linear equation to an infinite impulse response (IIR) filter controlled by the intersymbol interference effects parameter for generating the intersymbol interference effects in the waveform record file.

* * * * *